(12) United States Patent
Yanaka (10) Patent No.: US 7,459,796 B2
(45) Date of Patent: Dec. 2, 2008

(54) BGA-TYPE MULTILAYER CIRCUIT WIRING BOARD

(75) Inventor: Masaaki Yanaka, Tokyo (JP)

(73) Assignee: Toppan Printing Co., Ltd. (JP)

( * ) Notice: Subject to any disclaimer, the term of this patent is extended or adjusted under 35 U.S.C. 154(b) by 197 days.

(21) Appl. No.: 11/410,560

(22) Filed: Apr. 24, 2006

(65) Prior Publication Data

US 2006/0237843 A1 Oct. 26, 2006

(30) Foreign Application Priority Data

Apr. 25, 2005 (JP) .............................. 2005-126296

(51) Int. Cl.
- H01L 23/48 (2006.01)
- H01L 23/52 (2006.01)
- H01L 29/40 (2006.01)

(52) U.S. Cl. .................... 257/786; 257/698; 257/780

(58) Field of Classification Search ................ 257/778, 257/698, 786, 784, 781, 782
See application file for complete search history.

(56) References Cited

U.S. PATENT DOCUMENTS 5,798,563 A * 8/1998 Feilchenfeld et al. ....... 257/668
6,841,883 B1 * 1/2005 Farnworth et al. .......... 257/777
2002/0030266 A1 * 3/2002 Murata ...................... 257/698
2004/0262735 A1 * 12/2004 Higashi et al. ............. 257/686

* cited by examiner

Primary Examiner—S. V Clark
(74) Attorney, Agent, or Firm—Squire, Sanders & Dempsey L.L.P.

(57) ABSTRACT

Provided is a BGA-type multilayer circuit wiring board which is mounted on a printed wiring board directly via a solder ball with the electrode pad for solder ball connection formed thereon and in which the electric connection reliability of the filled via connected to the electrode pad for solder ball connection is not worsened. A wiring layer is formed on both surfaces of an insulating substrate; an electrode pad for solder bump for mounting a semiconductor chip thereon is formed on one surface of the substrate via an insulating layer; and an electrode pad for solder ball for connecting the structure to a printed wiring board is formed on the other surface thereof. The electrode pad for solder ball is electrically connected to the filled via; and the filled via is disposed in the intermediate position between the neighboring electrode pads for solder ball connection.

2 Claims, 14 Drawing Sheets

BGA-TYPE MULTILAYER CIRCUIT WIRING BOARD

BACKGROUND OF THE INVENTION

1. Field of the Invention

The present invention relates to a BGA-type multilayer circuit wiring board on which semiconductor chips are mounted.

2. Background Art

Recently developed, some semiconductor devices such as semiconductor large-scale integrated circuits (LSI) have an operation speed on a GHz level as clock frequency. Such high-speed semiconductor devices have a high integration degree of transistors, in which, therefore, the number of input/output terminals may be over 1000.

For mounting such a multi-terminal semiconductor device on a printed wiring board, a multilayer circuit wiring board is disposed between the semiconductor device and the printed board, and it acts for electric interconnection between the two. The multilayer circuit wiring board has an extremely thinner layer structure than a printed board and has a microfabricated line-and-space wiring pattern in order that it may satisfy good interconnection with the terminals of such a high-density semiconductor device.

For example, BGA (ball grid array) or CSP (chip size package) multilayer circuit wiring boards are now widely in practical use in the art.

For satisfying the recent requirements for higher density packaging and higher operation frequency, a technique of fabricating a multilayer circuit wiring board has become developed, which comprises laminating polyimide resin films each with a wiring layer formed thereon, without a core board, so as to reduce the overall thickness of the resulting multilayer circuit wiring board and to shorten the interlayer connection length thereof enough for high-frequency operation.

Figure 2A:
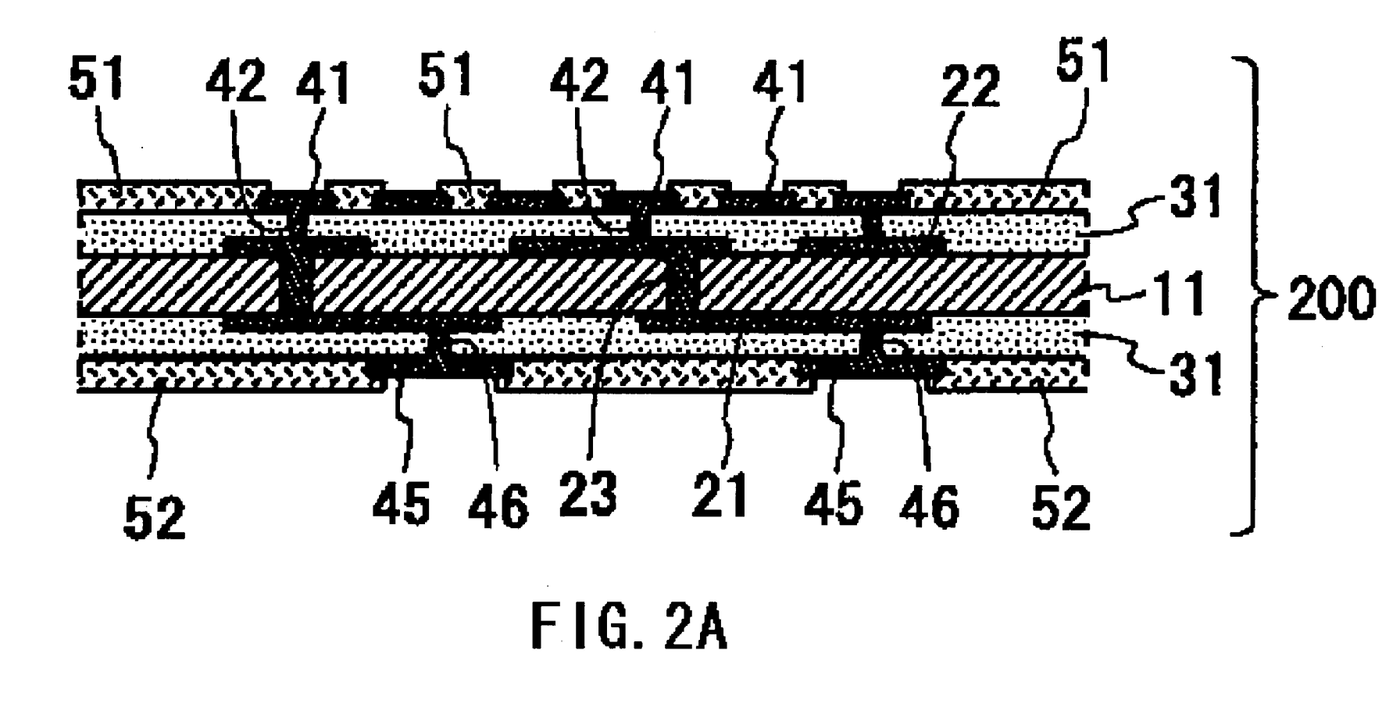
FIG. 2A is a partly-cut schematic cross-sectional view showing an example of a conventional, BGA-type multilayer circuit wiring board.
Figure 2B:
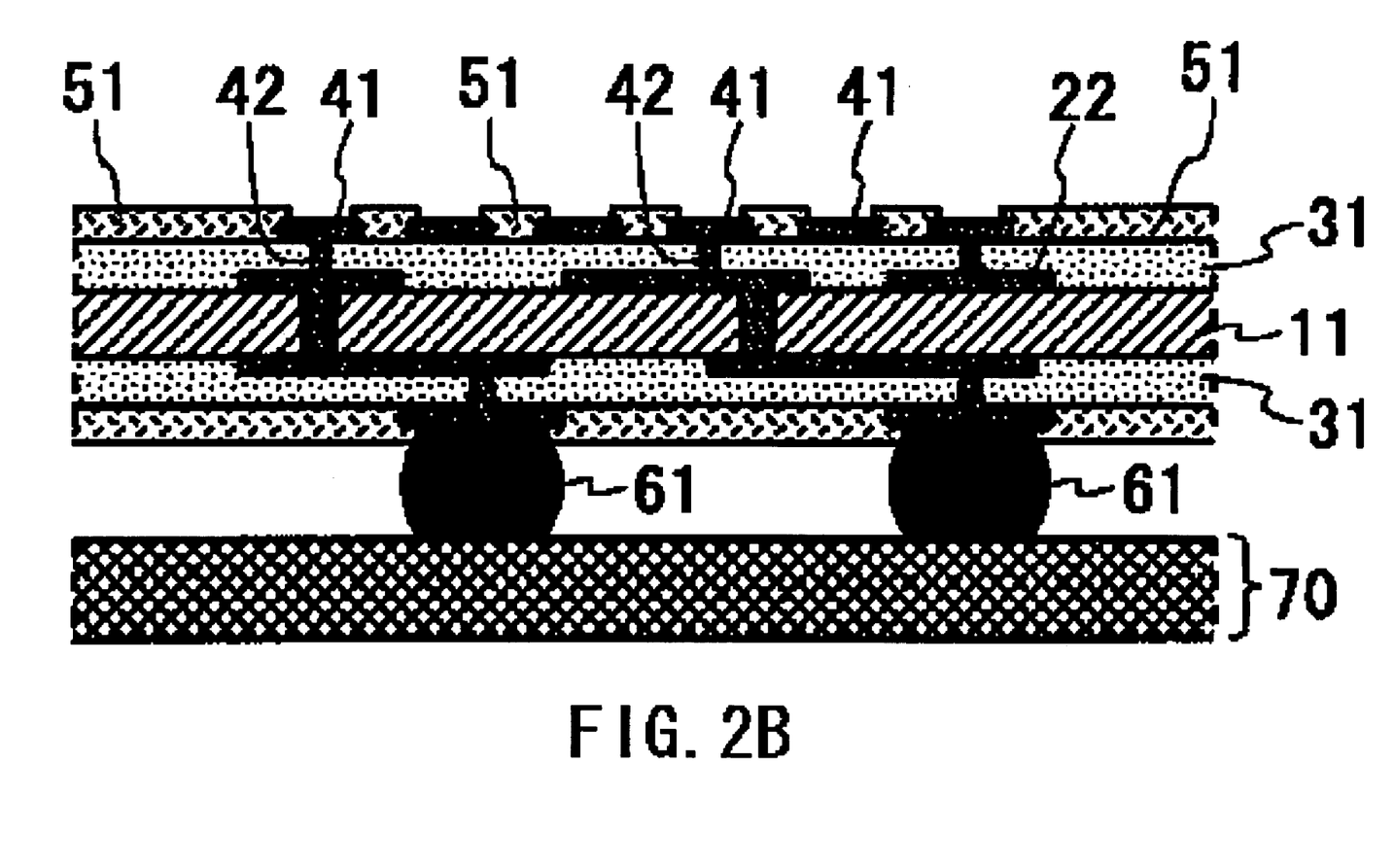
FIG. 2B is a partly-cut schematic cross-sectional view showing an example of the conventional, BGA-type multilayer circuit wiring board 200 mounted on a printed wiring board 70 via solder balls 61 therebetween.

FIG. 2A is a partly-cut schematic cross-sectional view showing an example of a BGA-type multilayer circuit wiring board having a 4-layered structure; and FIG. 2B is a partly-cut schematic cross-sectional view showing an example of the multilayer circuit wiring board 200 mounted on a printed wiring board 70 with solder balls 61.

The multilayer circuit wiring board 200 comprises an insulating substrate 11 with a wiring layer 21 and a wiring layer 22 formed on both surfaces thereof, in which the wiring layer 21 and the wiring layer 22 are electrically connected to each other via a filled via 23. An electrode pad for solder bump 41, which is for semiconductor chip connection, is formed on one surface of the structure as interrupted by an insulating layer 31 formed therebetween, while an electrode pad for solder ball 45 is formed on the other surface thereof, which is for connection of the structure to a printed wiring board.

The electrode pad for solder bump 41 is electrically connected to the wiring layer 22 via a filled via 42; and the electrode pad for solder ball 45 is to the wiring layer 21 via a filled via 46 at the center of the electrode pad for solder ball 45.

In the region except the electrode pad for solder bump 41 and the electrode pad for solder ball 45, formed are a solder resist layers 51 and 52.

Figure 4:
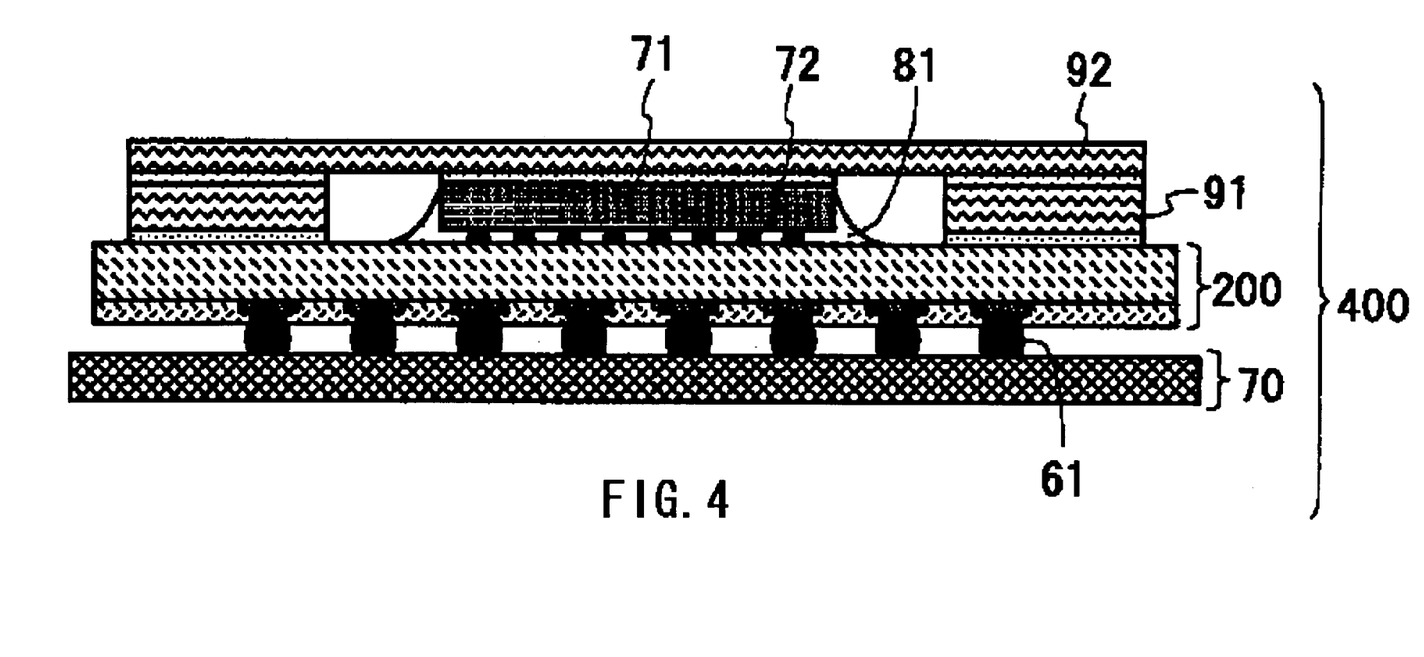
FIG. 4 is a schematic cross-sectional view showing an example of a package board fabricated by mounting the conventional BGA-type multilayer circuit wiring board 200 on a printed wiring board 70 via solder balls 61 therebetween.

FIG. 4 shows an ordinary package structure comprising the above-mentioned multilayer circuit wiring board 200.

On the upper surface of the multilayer circuit wiring board 200, mounted is a semiconductor chip 71 by solder bumps 72. Since the multilayer circuit wiring board 200 is thin and may be readily warped, a frame plate, generally referred to as a stiffener 91, is often fitted around the semiconductor chip 71. To the upper surface of the chip, a radiating plate, generally referred to as a lid 92, is stuck (for example, see Patent Reference 1).

On the lower surface of the multilayer circuit wiring board 200, a large number of solder balls are formed in array. In this condition, this is finally mounted on a printed circuit board 70 via the solder balls 61.

A problem with the multilayer circuit wiring board without the core board of the type is that, since the multilayer circuit wiring board is thin, it may be deformed and stress may occur in the wiring layer inside the multilayer circuit wiring board.

In particular, stress may readily concentrate in the filled vias acting for electric interconnection of the wiring layers.

Electric wiring becomes minute, and a diameter of filed via tends to shrink to satisfy a required electrical characteristic. Therefore the stress that filled via is born becomes small, and electric link reliability falls.

Different from ordinary built-up boards, the multilayer circuit wiring board of the type is so designed that solder balls are directly connected to the lower surface of the multilayer circuit wiring board, not via a thin printed board (core board) therebetween, as so mentioned in the above.

Accordingly, as in FIG. 2A, in the filled via 46 formed inside the solder ball connection pad 45, there may often occur thermal deformation owing to the difference in the thermal expansion coefficient between the multilayer circuit wiring board and the solder ball or the printed board, and it may cause a problem in point of the circuit interconnection reliability.

In a BGA type multilayer circuit wiring board having the electric wiring layers which the number of the layer is more than 4, there are much number of filled vias. Even more particularly, a difference between coefficient of thermal expansion of the central insulator layer and coefficient of thermal expansion of the adhesive line laminated on the insulator layer is large. Therefore, by reason of thermal stress, electric link reliability falls.

Besides, when solder balls are lead-free solder, temperature in the mounting is about 260 degrees Celsius. In other words, this temperature is higher than the temperature (about 220 degrees Celsius) in mounting of a conventional eutectic solder. In addition, lead-free solder is harder than a eutectic solder. Difference between coefficient of thermal expansion of the lead-free solder and coefficient of thermal expansion of the multilayered circuit wiring board is larger. When a multilayered circuit wiring board is mounted on a circuit board, as a whole, stress is zero. In the case of the mounting with lead-free solder, difference between coefficient of thermal expansion in the mounting and coefficient of thermal expansion at the time of use is larger. Thus, as for the mounting with lead-free solder, stress to a multilayered circuit wiring board is larger.

Patent Reference 1: JP-A 2001-110926

SUMMARY OF THE INVENTION

The present invention has been made in consideration of the above-mentioned problems, and its object is to provide a BGA-type multilayer circuit wiring board which is mounted on a printed wiring board directly via a solder ball with the electrode pad for solder ball connection formed thereon and in which the electric connection reliability of the filled via connected to the electrode pad for solder ball connection is not worsened.

To attain the above-mentioned object thereof, the invention according to a first aspect provides a BGA-type multilayer circuit wiring board which comprises wiring layers formed as interrupted by an insulating layer put therebetween and electrically connected to each other via a filled via and comprises an electrode pad for solder bump connection for mounting a semiconductor chip on one surface thereof and an electrode pad for solder ball connection on the other surface thereof and does not have a core board, wherein the filled via of the outermost layer connected to the electrode pad for solder ball connection is disposed in a position shifted from the electrode pad for solder ball connection in a second aspect of the invention.

Preferably in the BGA-type multilayer circuit wiring board according to the first aspect, the filled via of the outermost layer connected to the electrode pad for solder ball connection is disposed in the intermediate position between the neighboring electrode pads for solder ball connection.

Preferably in the BGA-type multilayer circuit writing board, distance from center of the electrode pad for solder ball connection to center of the filled via is longer than double of radius of the electrode pad for solder ball connection.

Preferably in the BGA-type multilayer circuit writing board, the electrode pad for solder ball connection is for lead-free solder.

Preferably in the BGA-type multilayer circuit writing board, diameter of the filled via is 30 μm-60 μm.

Preferably in the BGA-type multilayer circuit writing board, the number of the wiring layers is more than four.

In the BGA-type multilayer circuit wiring board of the invention, the filled via of the outermost layer connected to the electrode pad for solder ball connection is preferably disposed in the intermediate position between the neighboring electrode pads for solder ball connection. Or the filled via of the outermost layer connected to the electrode pad for solder ball connection is disposed in a position shifted from the electrode pad for solder ball connection. Therefore, when the multilayer circuit wiring board is mounted on a printed circuit board by solder balls, then the filled via in the resulting package is hardly influenced by thermal deformation to be caused by the difference in the thermal expansion coefficient between the constitutive elements and the package may therefore ensure good electric interconnection reliability.

Even more particularly, when a diameter of filled via is 30 μm-60 μm, while keeping a superior electrical characteristic, connection reliability can be kept.

In the invention, in addition, since the pad surface for solder ball connection thereto is more flattened than in ordinary structures, it may improve the solder ball connection reliability.

In these drawings, 11 is an insulating substrate; 21, 22, 43 and 47 each are a wiring layer; 23, 42, 44, 46 and 48 each are a filled via; 31 is an insulating layer; 41 is an electrode pad for solder bump connection; 43p, 45 and 47p each are an electrode pad for solder ball connection; 51 and 52 each are a solder resist layer; 61 is a solder ball; 70 is a printed wiring board; 51b is an adhesiveness-reinforcing layer; 71 is a semiconductor chip; 72 is a solder bump; 81 is an under-fill; 91 is a stiffener; 92 is a lid; 100, 200 and 500 each are a BGA-type multilayer circuit wiring board; 300, 400 and 600 each are a package board.

DESCRIPTION OF THE PREFERRED EMBODIMENTS

Embodiments of the invention are described hereinunder.

Figure 1A:
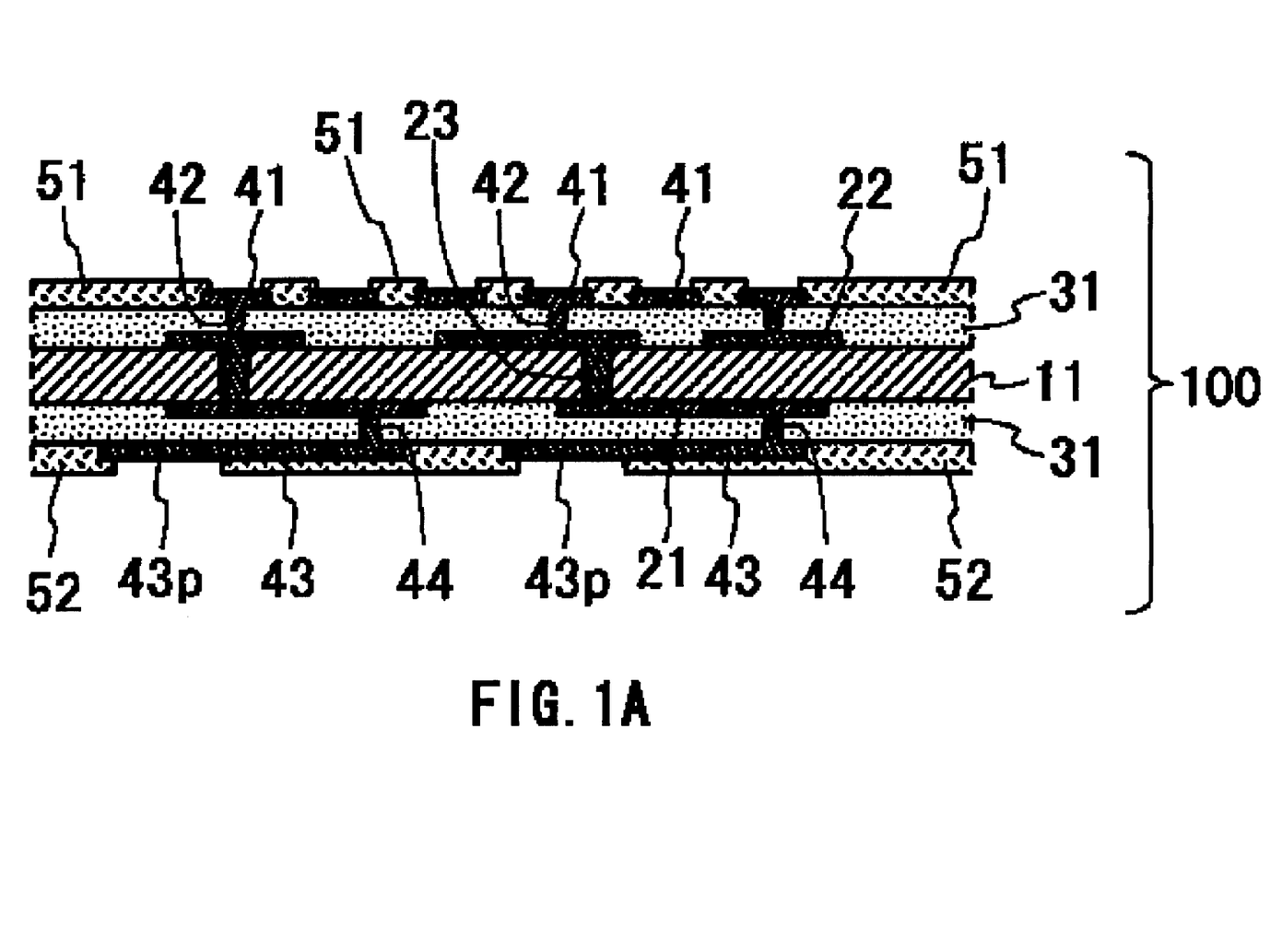
FIG. 1A is a partly-cut schematic cross-sectional view showing an example of a BGA-type multilayer circuit wiring board of the invention.
Figure 1B:
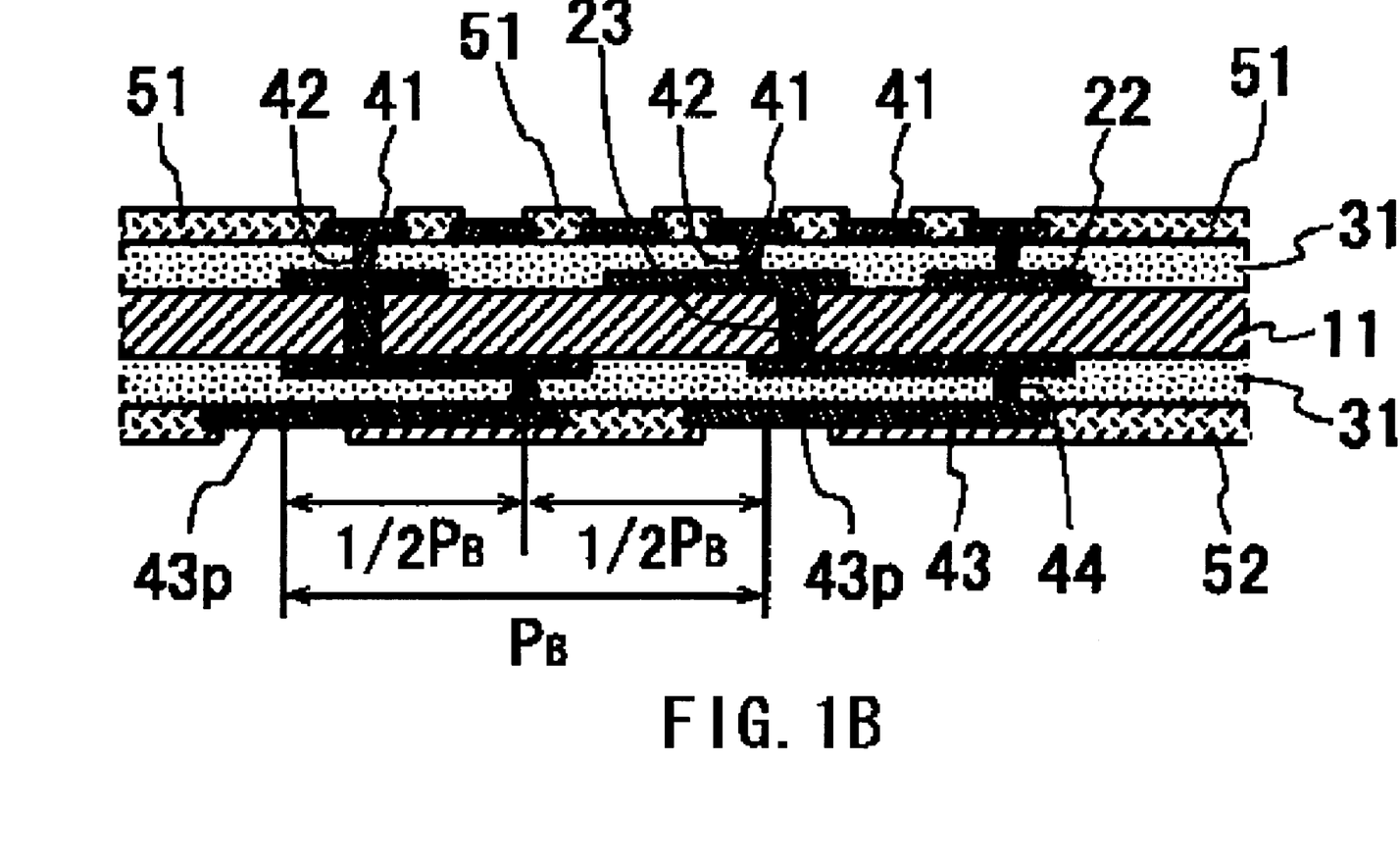
FIG. 1B is a partly-cut schematic cross-sectional view showing the positional relationship between an electrode pad for solder ball connection 43p and a filled via 44.
Figure 1C:
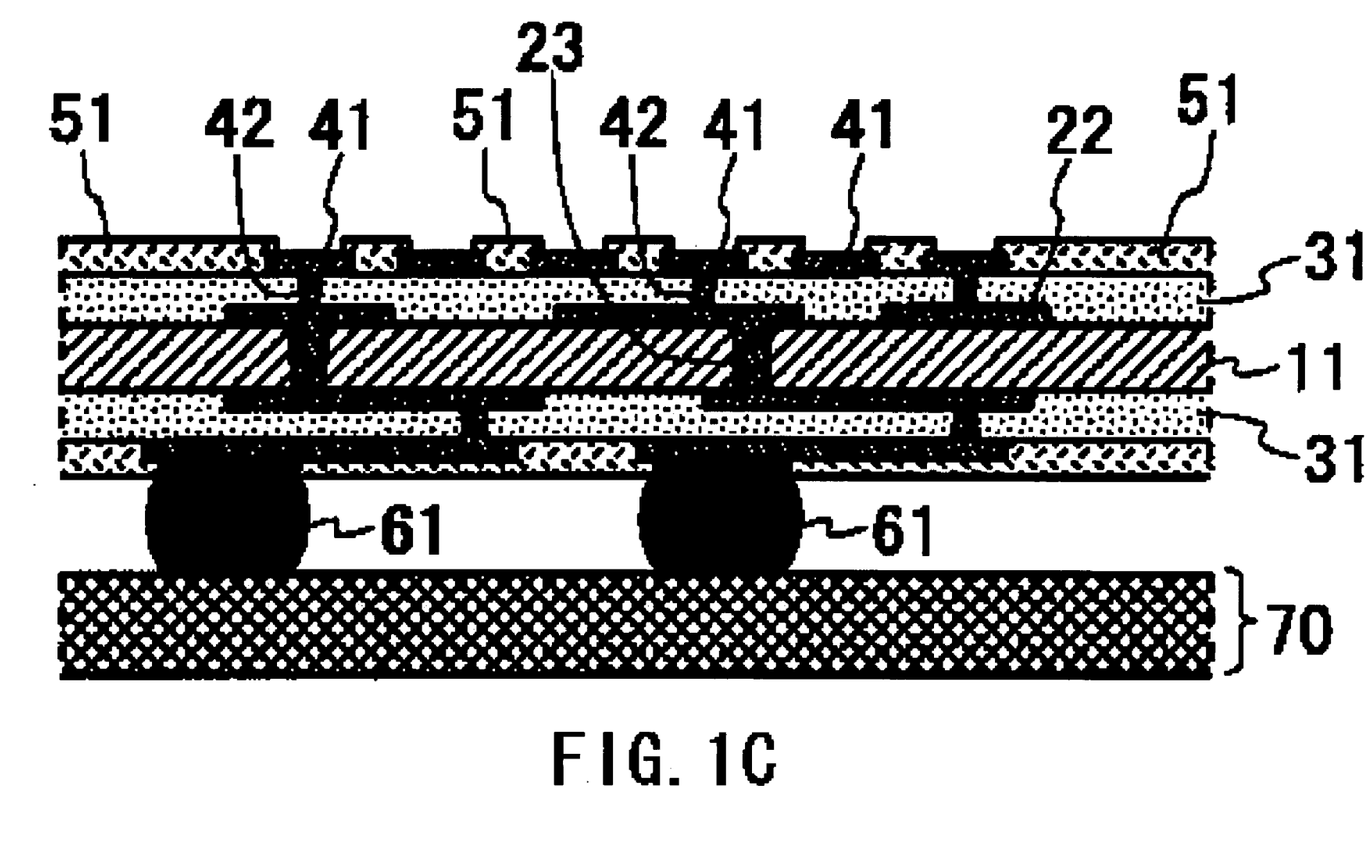
FIG. 1C is a partly-cut schematic cross-sectional view showing an example of mounting a BGA-type multilayer circuit wiring board 100 on a printed wiring board 70 via solder balls 61 therebetween.

FIG. 1A is a partly-cut schematic cross-sectional view showing an example of the BGA-type multilayer circuit wiring board of the invention; FIG. 1B is a partly-cut schematic cross-sectional view showing the positional relationship between an electrode pad for solder ball connection 43p and a filled via 44; and FIG. 1C is a partly-cut schematic cross-sectional view showing an example of mounting the multilayer circuit wiring board 100 on a printed wiring board 70 via solder balls 61 therebetween.

The BGA-type multilayer circuit wiring board 100 of the invention comprises a wiring layer 21 and a wiring layer 22 formed on both surfaces of an insulating substrate 11, in which the wiring layer 21 and the wiring layer 22 are electrically connected to each other via a filled via 23. On one surface of the wiring board 100, formed is an electrode pad for solder bump 41 for connection of a semiconductor chip thereto, via an insulating layer 31; and on the other surface thereof, formed is an electrode pad for solder ball 43p for connection of a printed wiring board thereto.

A manufacturing method of BGA type multilayer circuit wiring board 100 is explained below. Electric wiring layer 21 and electric wiring layer 22 are formed on both sides of central insulation substrate 11. Insulator layers 31 with a copper foil are put on these electric wiring layers by means of an adhesive layer. An embodiment of the BGA type multilayer circuit wiring board that electric wiring layer is four levels is shown. However, by means of laminating plural insulator layers with a copper foil, a wiring board of six levels or eight levels can be made. In another embodiment, it is laminated only on one surface of insulation substrate 11 without laminating on both sides of insulation substrate 11. In another embodiment, by means of affixing plural multilayer wiring boards, one piece of multilayer wiring board can be made. When BGA type multilayer circuit wiring board comprises plural insulator layers and adhesive layers in this way, influence of heat deformation due to difference of coefficient of thermal expansion is larger.

The electrode pad for solder ball connection 43p is formed at the tip of a wiring layer 43, and this is electrically connected to the filled via 44 via the wiring layer 43 and the insulating layer 31.

In this, the position of the filled via of the outermost layer is shifted from the position of the electrode pad for solder ball connection, not overlapping with each other.

In that manner, the filled via 44 is so disposed that the electrode pad for solder ball connection 43p adjacent thereto is shifted from the position of the filled via 44, and accordingly, when the multilayer circuit wiring board 100 is packaged with a printed wiring board 70 by solder balls 61, then the filled via 44 in the resulting package is hardly influenced by thermal deformation to be caused by the difference in the thermal expansion coefficient between the constitutive elements and the package may therefore ensure good electric interconnection reliability.

The embodiment that plural electrode pads for solder balls connection are near a filled via is explained below. Filled beer should be equally away from plural electrode pads for solder balls connection.

Distance between center of an electrode pad for solder ball connection and center of external layer filled via connected by the electrode pad for solder ball connection should be longer than double radial of electrode pad for solder ball connection. For this case, filled via of mounted substrate which is provided by mounting a multilayered circuit wiring board on a circuit board by using of solder ball is hard to be affected by heat deformation by difference of coefficient of thermal expansion. In addition, electric link reliability can be maintained sufficiently.

In particular, the positional relationship between the electrode pad for solder ball 43p and the filled via 44 is preferably so designed that, when the distance between the neighboring electrode pads for solder ball connection 43p is represented by $P_B$, then the filled via 44 is disposed in the intermediate position, at ½ of the distance $P_B$ between the neighboring electrode pads for solder ball connection 43p, as in FIG. 1B.

Figure 5A:
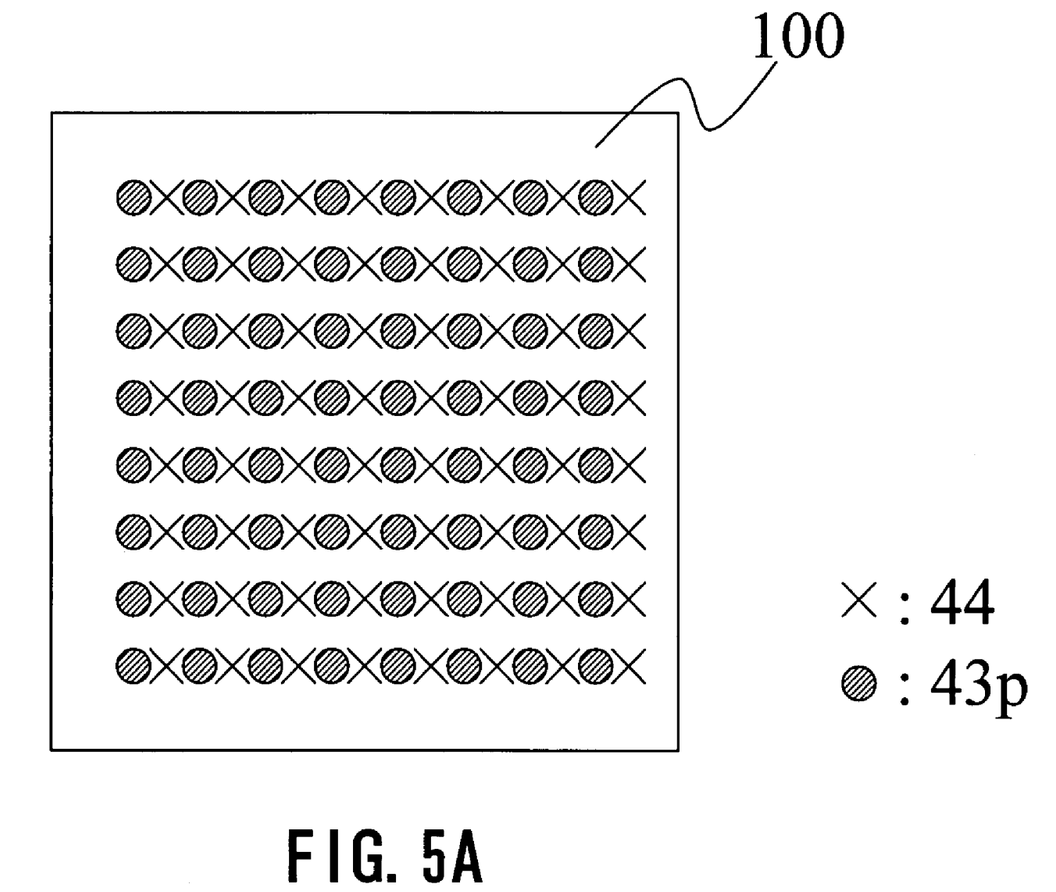
FIGS. 5A and 5C are top views of configuration of filled via and electrode pad for solder ball connection of a BGA type multilayer circuit wiring board of the present invention.
Figure 5B:
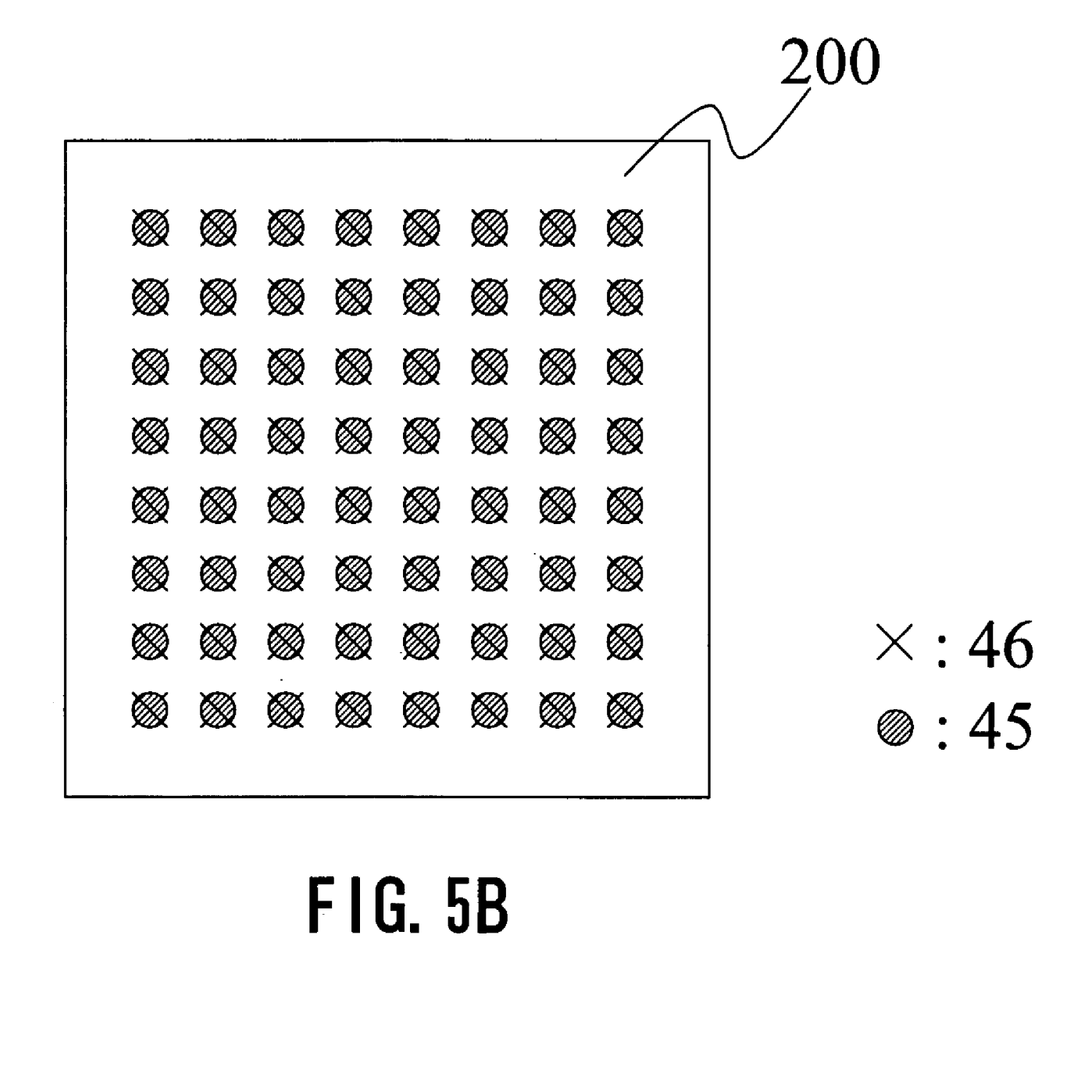
FIG. 5B is a top view in configuration of filled via and electrode pad for solder ball connection of a conventional BGA type multilayer circuit wiring board.
Figure 5C:
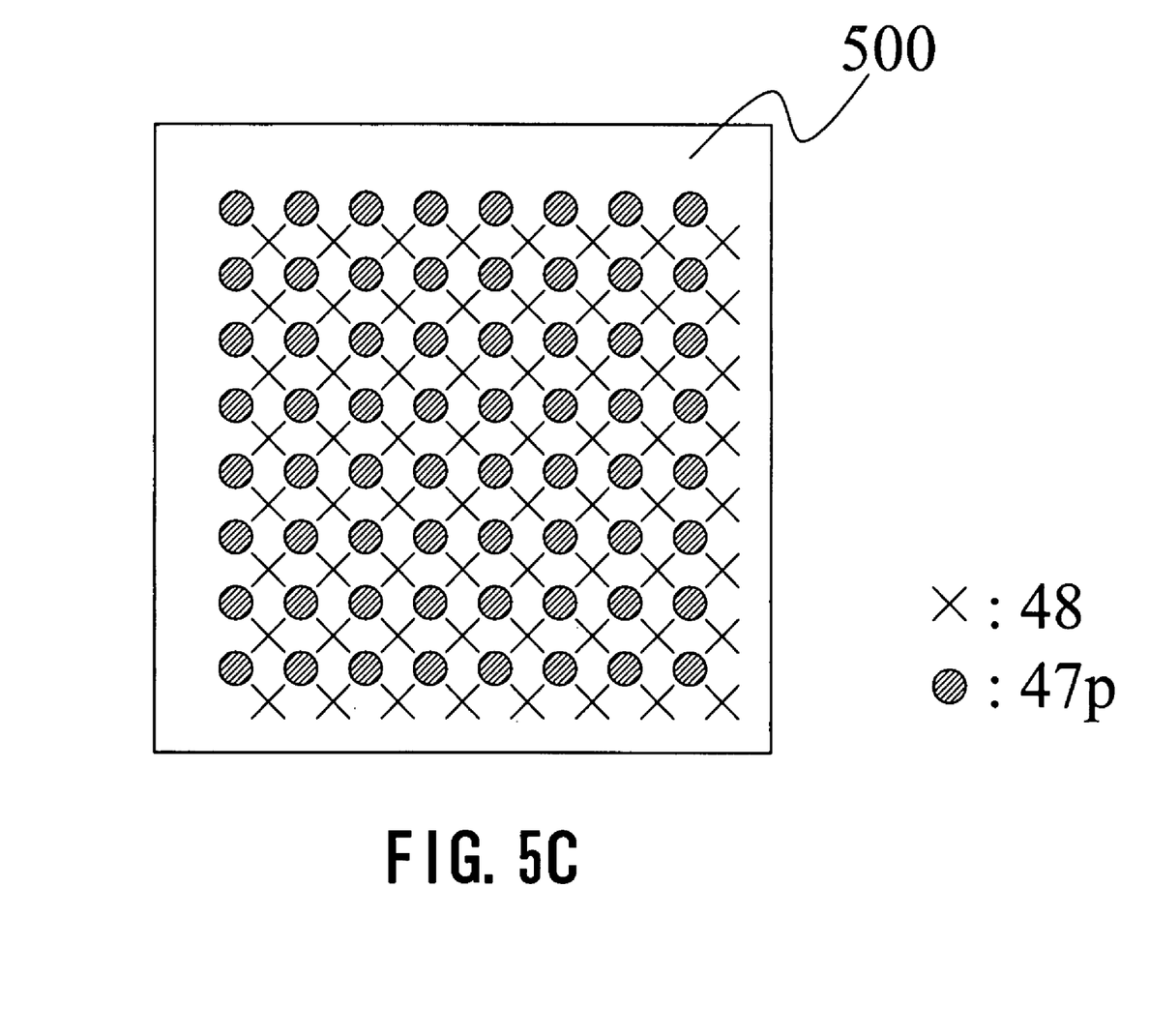
Figure 6A:
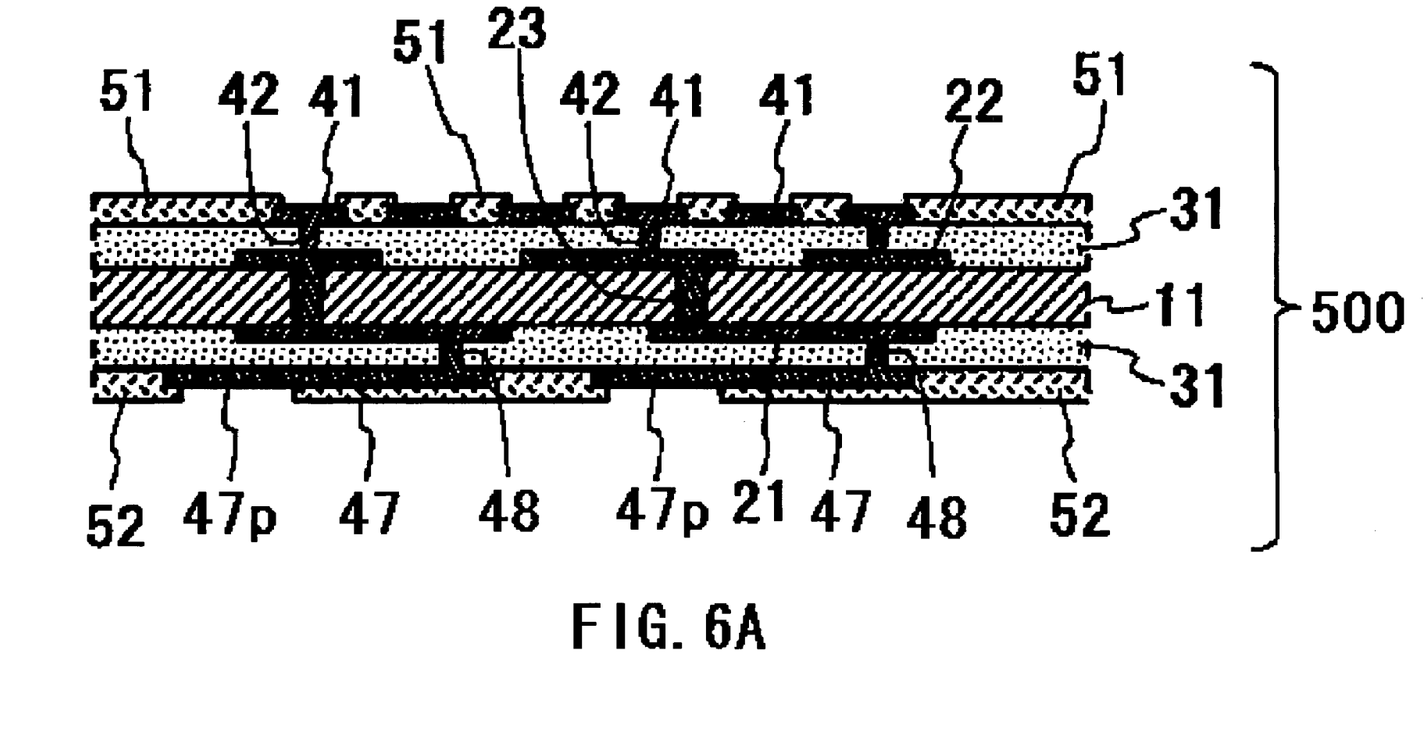
FIG. 6A is a partly-cut schematic cross-sectional view showing another example of a BGA-type multilayer circuit wiring board of the invention and is cross figure along diagonal of an electrode pad for solder balls connection placed in the shape of an array.
Figure 6B:
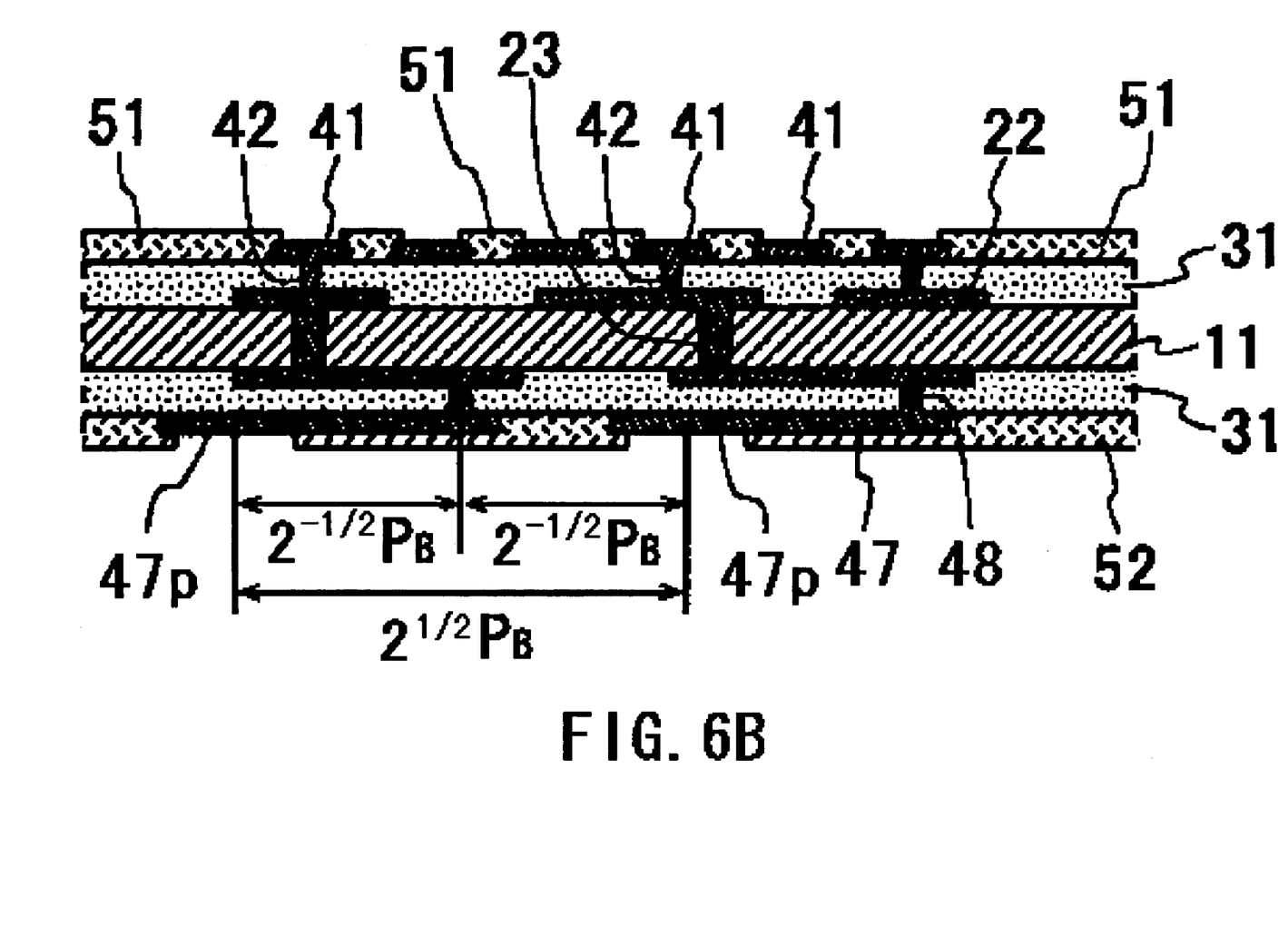
FIG. 6B is a partly-cut schematic cross-sectional view showing the positional relationship between an electrode pad for solder ball connection 47p and a filled via 48.
Figure 6C:
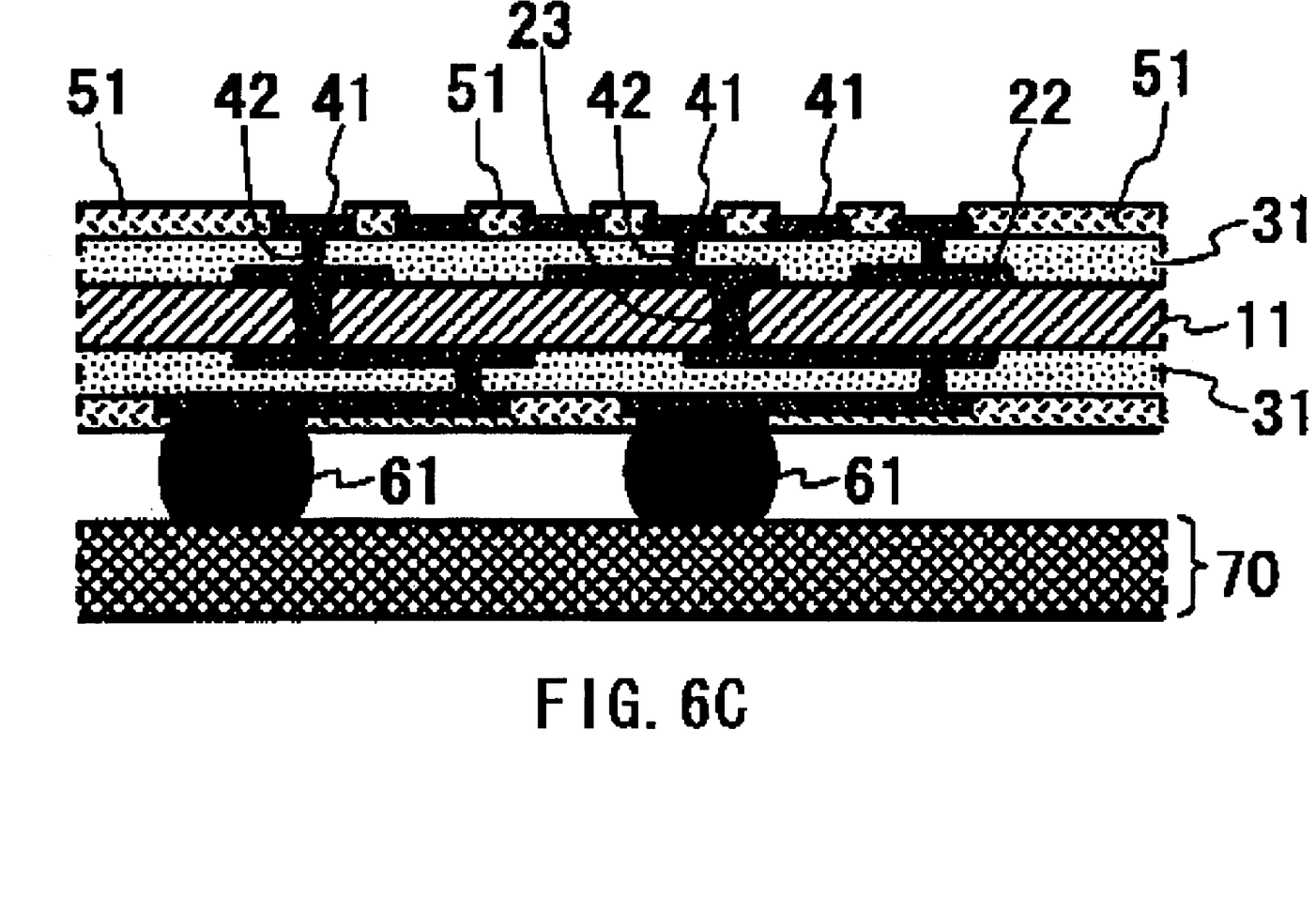
FIG. 6C is a partly-cut schematic cross-sectional view showing an example of mounting a BGA-type multilayer circuit wiring board 500 on a printed wiring board 70 via solder balls 61 therebetween.

In addition, when electrode pads for solder ball connection are formed in the shape of array, as shown in FIG. 6B and FIG. 5(c), it is desirable that filled via is placed at intermediate position of four neighboring electrode pads 47p for solder balls connection.

In this way, when electrode pads for solder balls connection are formed in the shape of array, filled via in array border should be shifted only same distance in the same direction as filled via of array internal. By means of the above described configuration, advantage offered by the invention can be obtained. (See FIGS. 5 A, 5C).

In the invention, in addition, since the surface of the solder ball connection pad 43p is more flattened than in ordinary structures, it may improve the solder ball connection reliability.

20 μm-60 μm are desirable in an aspect of an electrical characteristic for radius of filled via formed in multilayered circuit wiring board. Preferably it is equal to or less than 50 μm. When connection reliability is considered, 30 μm-80 μm are preferable. When radius of filled via is equal to or less than 30 μm, the rate of occurrence that filled via is cut rises. Preferably it is more than 40 μm. Thus, from the viewpoint of electrical characteristic and connection reliability, 30 μm-60 μm are preferable.

EXAMPLE 1

12 μm-thick copper foil was laminated on both surfaces of an insulating substrate 11 formed of a 25.4 μm-thick polyimide film to prepare a laminate substrate double-lined with copper. This was then holed for vias, plated with copper and patterned to form a wiring layer 21, a wiring layer 22 and a filled via 23, thereby fabricating a double-wiring board.

Next, on both surfaces of the double-wiring board, formed were a 5 μm-thick epoxy resin film and a 13 μm-thick polyimide resin film to be an insulating layer 31 thereon. Then, according to a semi-additive process, an electrode pad for solder bump connection 41 and a filled via 42 were formed on one surface of the structure; and a wiring layer 43, an electrode pad for solder ball connection 43p and a filled via 44 were on the other surface thereof.

In this, the diameter of the electrode pad for solder ball connection 43p was 500 μm, and 1600 of the electrode pads in total were formed in array at regular intervals of 1 mm. The filled vias 44 were disposed at a position of 500 μm, ½ of the distance, 1 mm between the two neighboring electrode pads for solder ball connection 43p.

Further, solder resist layers 51 and 52 were formed, thereby fabricating a four-layered, BGA-type multilayer circuit wiring board 100 of the invention (see FIG. 1A).

A top view of configuration of filled vias 44 and electrode pads 43p for solder balls connection of BGA type multilayer circuit wiring board 100 made in example 1 is shown in FIG. 5A.

EXAMPLE 2

Figure 3:
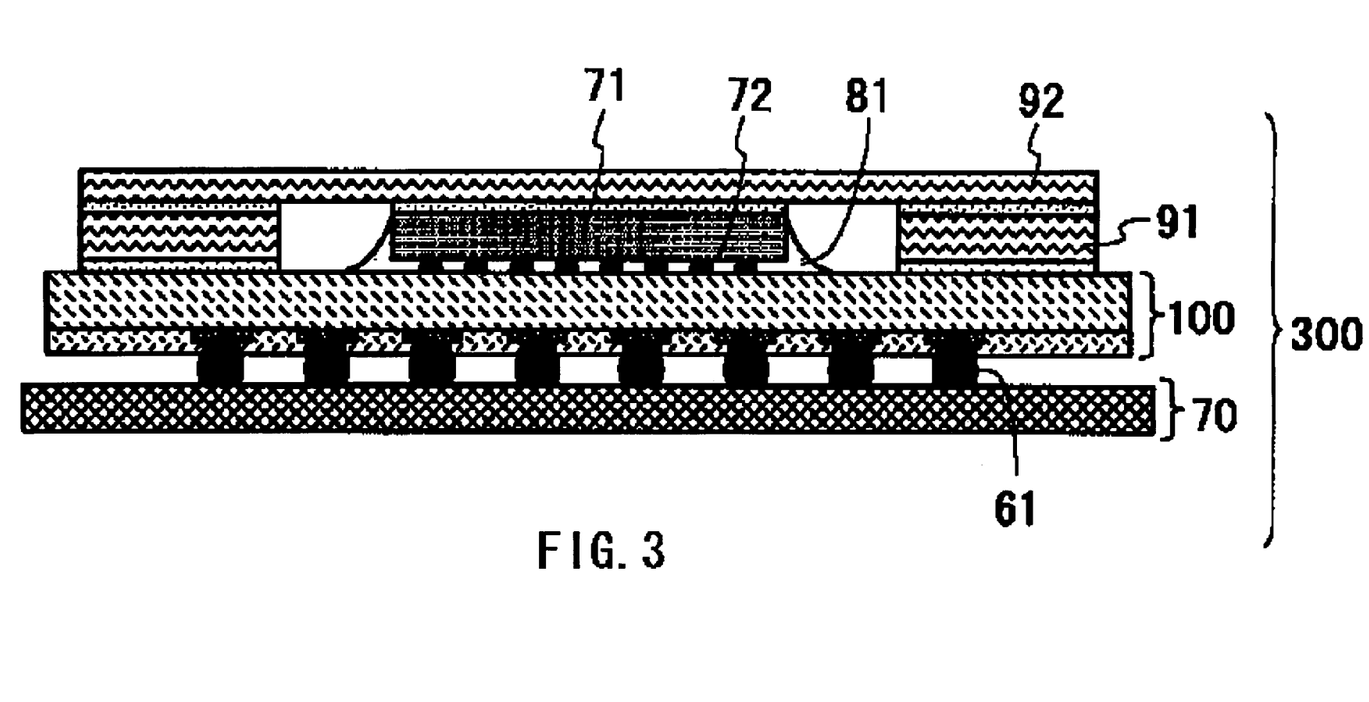
FIG. 3 is a schematic cross-sectional view showing an example of a package board fabricated by mounting the BGA-type multilayer circuit wiring board 100 of the invention on a printed wiring board 70 via solder balls 61 therebetween.

Solder paste was screen-printed on the electrode pad 41. Then lead-free solder bump 72 was formed by reflow of the solder paste. A 0.5 mm-thick stiffener 91 was stuck to the upper surface of the BGA-type multilayer circuit wiring board 100 fabricated in Example 1, and then, at the center of the board, a 15 mm-square semiconductor chip 71 was mounted on it via lead-free solder bumps 72. A resin was filled between the semiconductor chip 71 and the multilayer circuit wiring board 100 to form an under-fill 81, and a lid 92 was stuck to the upper surface of the semiconductor chip 71.

Next, on the electrode pad for solder ball connection 43p on the lower surface of the BGA-type multilayer circuit wiring board 100, formed was a lead-free solder ball having a diameter of 500μ; and finally, this was mounted on a 2 mm-thick multilayer printed wiring board 70 in a mode of solder ball packaging to fabricate a package board 300 (see FIG. 3).

In the package board 300, the outermost surface wiring of the printed wiring board 70, the solder balls and internal wiring of the multilayer circuit wiring board 100 form a series daisy chain circuit including the filled vias of the outermost layer on the solder ball-connected surface of the structure; and from the electrode (not shown) on the surface of the printed wiring board 70, the electric interconnection of the circuit can be confirmed.

EXAMPLE 3

Example 3 is a comparative example.

12 μm-thick copper foil was laminated on both surfaces of an insulating substrate 11 formed of a 25.4 μm-thick polyimide film to prepare a laminate substrate double-lined with copper. This was then patterned and plated with copper to form a wiring layer 21, a wiring layer 22, and a filled via 23, thereby fabricating a double-wiring board.

Next, on both surfaces of the double-wiring board, formed were a 5 μm-thick epoxy resin film and a 13 μm-thick polyimide resin film to bean insulating layer 31 thereon. Then, according to a semi-additive process, an electrode pad for solder bump connection 41 and a filled via 42 were formed on one surface of the structure; and an electrode pad for solder ball connection 45 and a filled via 46 were on the other surface thereof.

In this, the diameter of the electrode pad for solder ball connection 45 was 500 μm, and 1600 of the electrode pads in total were formed in array at regular intervals of 1 mm. The filled via 46 was disposed nearly at the center of the electrode pad for solder ball connection 45.

Further, solder resist layers 51 and 52 were formed, thereby fabricating a four-layered, BGA-type multilayer circuit wiring board 200 for comparison (see FIG. 2A).

A top view of configuration of filled vias 46 and electrode pads 45 for solder balls connection of BGA type multilayer circuit wiring board 200 made in example 3 is shown in FIG. 5c.

EXAMPLE 4

Example 4 is a comparative example.

Solder paste was screen-printed on the electrode pad 41. Then lead-free solder bump 72 was formed by reflow of the solder paste. A 0.5 mm-thick stiffener 91 was stuck to the upper surface of the BGA-type multilayer circuit wiring board 200 fabricated in Example 3, and then, at the center of the board, a 15 mm-square semiconductor chip 71 was mounted on it via lead-free solder bumps 72. A resin was filled between the semiconductor chip 71 and the multilayer circuit wiring board 200 to form an under-fill 81, and a lid 92 was stuck to the upper surface of the semiconductor chip 71.

Next, on the electrode pad for solder ball connection 45 on the lower surface of the BGA-type multilayer circuit wiring board 200, formed was a lead-free solder ball having a diameter of 500 μm; and finally, this was mounted on a 2 mm-thick multilayer printed wiring board 70 in a mode of solder ball packaging to fabricate a package board 400 (see FIG. 4).

In the package board 400, the outermost surface wiring of the printed wiring board 70, the solder balls and internal wiring of the multilayer circuit wiring board 200 form a series daisy chain circuit including the filled vias of the outermost layer on the solder ball-connected surface of the structure; and from the electrode (not shown) on the surface of the printed wiring board 70, the electric interconnection of the circuit can be confirmed.

EXAMPLE 5

Same as example 1, 12 μm-thick copper foil was laminated on both surfaces of an insulating substrate 11 formed of a 25.4 μm-thick polyimide film to prepare a laminate substrate double-lined with copper. This was then holed for vias, plated with copper and patterned to form a wiring layer 21, a wiring layer 22 and a filled via 23, thereby fabricating a double-wiring board.

Next, on both surfaces of the double-wiring board, formed were a 5 μm-thick epoxy resin film and a 13 μm-thick polyimide resin film to be an insulating layer 31 thereon. Then, according to a semi-additive process, an electrode pad for solder bump connection 41 and a filled via 42 were formed on one surface of the structure; and a wiring layer 47, an electrode pad for solder ball connection 47p and a filled via 48 were on the other surface thereof.

In this, the diameter of the electrode pad for solder ball connection 47p was 500 μm, and 1600 of the electrode pads in total were formed in array at regular intervals of 1 mm. The filled vias 48 were disposed at a center position where is same distant from four neighboring electrode pads for solder ball connection 47p. The distance from the center position of each electrode pads for solder ball connection 47p to the center position of the filled vias 48 is 0.7 mm, which is $2^{-1/2}$ times of 1 mm, which is the interval.

Further, solder resist layers 51 and 52 were formed, thereby fabricating a four-layered, BGA-type multilayer circuit wiring board 500 of the invention (see FIG. 6A). A top view of configuration of filled vias 48 and electrode pads 47p for solder balls connection of BGA type multilayer circuit wiring board 500 made in example 5 is shown in FIG. 5C.

EXAMPLE 6

Figure 7:
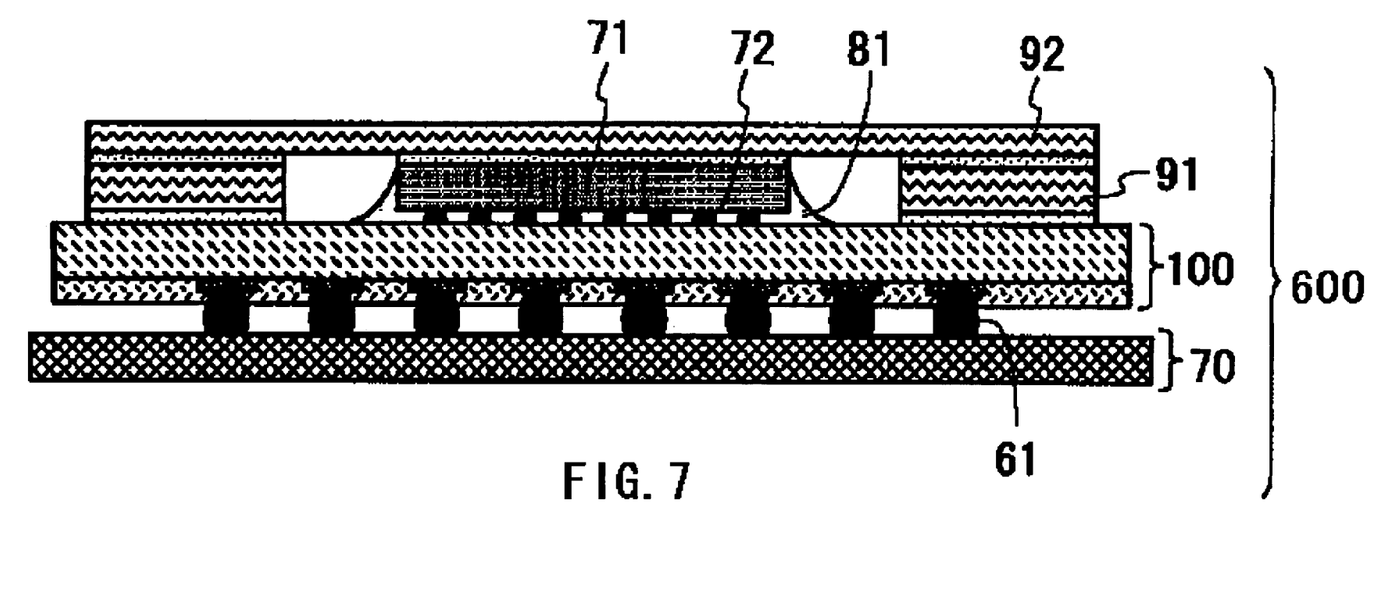
FIG. 7 is a schematic cross-sectional view showing an example of a package board fabricated by mounting the BGA-type multilayer circuit wiring board 500 of the invention on a printed wiring board 70 via solder balls 61 therebetween.

Solder paste was screen-printed on the electrode pad 41. Then lead-free solder bump 72 was formed by reflow of the solder paste. A 0.5 mm-thick stiffener 91 was stuck to the upper surface of the BGA-type multilayer circuit wiring board 500 fabricated in Example 5, and then, at the center of the board, a 15 mm-square semiconductor chip 71 was mounted on it via lead-free solder bumps 72. A resin was filled between the semiconductor chip 71 and the multilayer circuit wiring board 500 to form an under-fill 81, and a lid 92 was stuck to the upper surface of the semiconductor chip 71.

Next, on the electrode pad for solder ball connection 47p on the lower surface of the BGA-type multilayer circuit wiring board 500, formed was a lead-free solder ball having a diameter of 500 μm; and finally, this was mounted on a 2 mm-thick multilayer printed wiring board 70 in a mode of solder ball packaging to fabricate a package board 600 (see FIG. 7).

In the package board 600, the outermost surface wiring of the printed wiring board 70, the solder balls and internal wiring of the multilayer circuit wiring board 500 form a series daisy chain circuit including the filled vias of the outermost layer on the solder ball-connected surface of the structure; and from the electrode (not shown) on the surface of the printed wiring board 70, the electric interconnection of the circuit can be confirmed.

The package board 300, the package board 400 and the package board 600 fabricated in Example 2, Example 4 and Example 6, respectively, were set in a thermal cycle tester, and subjected to a thermal cycle test between 125° C., and −40° C. During the test, the daisy chain circuit was monitored for the electric interconnection therein.

As a result, the package board 300 comprising the BGA-type multilayer circuit wiring board 100 of the invention kept the electric interconnection in about 1800 cycles, and its reliability was significantly improved.

In addition, the package board 600 comprising the BGA-type multilayer circuit wiring board 500 of the invention kept the electric interconnection in about 2000 cycles, and its reliability was more improved.

As opposed to it, the package board 400 comprising the conventional, BGA-type multilayer circuit wiring board 200 in which the filled via was formed at the center of the solder ball connection pad resulted in electric interconnection "NG" in about 600 cycles.

The above-mentioned thermal cycle test results confirmed the following: In the package board 300 comprising the BGA-type multilayer circuit wiring board 100 of the invention, in which the filled via 44 of the BGA-type multilayer circuit wiring board 100 is positioned nearly in the center part between the two neighboring electrode pads for solder ball connection 43p, the filled via 44 is not influenced by thermal deformation to be caused by the difference in the thermal expansion coefficient between the BGA-type multilayer circuit wiring board 100 and the solder ball 61 or the printed wiring board. Specifically, since the filled via is free from the restraint of BGA, the deformation inside the via does not concentrate in one point but may uniformly distribute, therefore not detracting from the electric interconnection reliability of the package board.

For this case, distance from center of electrode pad 43p for solder balls connection to center of filled via 44 is longer than double of radius of electrode pad 43p for solder balls connection.

If filled via 48 of BGA type multilayer circuit wiring board 500 is placed approximately at an intermediate position of the four neighboring electrode pads 47p for solder ball connection, result of thermal cycle test can be more improved.

In the package board 400 comprising the conventional, BGA-type multilayer circuit wiring board 200, in which the solder ball 61 of high rigidity is directly formed on the electrode pad for solder ball connection 45 that is an upper wiring layer on the filled via 46, it has been confirmed that the upper part of the filled via 46 is restrained and is hardly deformed, and in place of it, deformation concentrates around the bottom surface of the via.

In addition, it has also been known that the deformation around the bottom surface of the filled via 46 increases in the low-temperature range of the thermal cycle. It may be presumed that the essential reason for it may be because the thermal expansion coefficient of the insulating layer 31 such as the insulating resin layer and the adhesive layer existing around the filled via 46 is larger than the thermal expansion coefficient of the wiring layer including the filled via 46, and therefore large thermal shrinkage of the structure may occur in the low-temperature range of the thermal cycle.

What is claimed is:

1. A BGA-type multilayer circuit wiring board, which comprises wiring layers formed as interrupted by an insulating layer put therebetween and electrically connected to each other via a filled via and comprises an electrode pad for solder bump connection for mounting a semiconductor chip on one surface thereof and an electrode pad for solder ball connection on the other surface thereof and does not have a core board, wherein the filled via of the outermost layer connected to the electrode pad for solder ball connection is disposed in a position shifted from the electrode pad for solder ball connection, and wherein distance from center of the electrode pad for solder ball connection to center of the filled via is longer than double of radius of the electrode pad for solder ball connection.

2. A BGA-type multilayer circuit wiring board, which comprises wiring layers formed as interrupted by an insulating layer put therebetween and electrically connected to each other via a filled via and comprises an electrode pad for solder bump connection for mounting a semiconductor chip on one surface thereof and an electrode pad for solder ball connection on the other surface thereof and does not have a core board, wherein the filled via of the outermost layer connected to the electrode pad for solder ball connection is disposed in a position shifted from the electrode pad for solder ball connection, and wherein diameter of the filled via is 30 μm-60 μm.

* * * * *